United States Patent
Huang (10) Patent No.: US 11,954,937 B2
(45) Date of Patent: Apr. 9, 2024

(54) FINGERPRINT SENSING SYSTEM (71) Applicant: Powerchip Semiconductor Manufacturing Corporation, Hsinchu (TW)

(72) Inventor: Chen-Ming Huang, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 123 days.

(21) Appl. No.: 17/203,725

(22) Filed: Mar. 16, 2021

(65) Prior Publication Data

US 2022/0245374 A1 Aug. 4, 2022

(30) Foreign Application Priority Data

Feb. 4, 2021 (TW) .................................. 110104177

(51) Int. Cl.
*G06V 40/13* (2022.01)
*G02B 3/00* (2006.01)
(Continued)

(52) U.S. Cl.
CPC ........... *G06V 40/13* (2022.01); *G02B 3/0056* (2013.01); *G02B 5/208* (2013.01); (Continued)

(58) Field of Classification Search
CPC .............. G06K 9/0004; G06V 40/1318; H01L 27/3227; H01L 27/3234; H01L 27/146; (Continued)

(56) References Cited

U.S. PATENT DOCUMENTS 8,274,051 B1 * 9/2012 Aswell .............. H01L 31/02162
250/339.05
10,014,335 B2 * 7/2018 Watanabe ............ H04N 25/135
(Continued)

FOREIGN PATENT DOCUMENTS

CN 111464727 7/2020
CN 111837132 A * 10/2020 ........... G06K 9/0004
(Continued)

OTHER PUBLICATIONS

"Office Action of Taiwan Counterpart Application", dated May 17, 2022, p. 1-p. 7.

*Primary Examiner* — Yuzhen Shen
(74) *Attorney, Agent, or Firm* — JCIPRNET (57) ABSTRACT

A fingerprint sensing system is configured to receive an illumination beam which is reflected by a finger and then transmitted to the fingerprint sensing system to generate a fingerprint image. The fingerprint sensing system includes a plurality of microlenses, a sensor, a first light filter layer, and a second light filter layer. The microlenses are arranged in an array. The sensor has a plurality of sensing pixels arranged in an array. The first light filter layer is disposed between the microlenses and the sensor and has a plurality of first openings. The second light filter layer is disposed between the first light filter layer and the sensor and has a plurality of second openings. The illumination beam passes through the first openings or the second openings, so that the sensor receives the illumination beam.

7 Claims, 7 Drawing Sheets (51) Int. Cl.
*G02B 5/20* (2006.01)
*H01L 27/146* (2006.01)

(52) U.S. Cl.
CPC .. *H01L 27/14621* (2013.01); *H01L 27/14627* (2013.01); *H01L 27/14678* (2013.01)

(58) Field of Classification Search
CPC .......... H01L 27/1461; H01L 27/14616; H01L 27/14609; H04N 5/374
See application file for complete search history.

(56) References Cited

U.S. PATENT DOCUMENTS

| | | | |
|---|---|---|---|
| 10,318,791 B2 | 6/2019 | He et al. | |
| 2003/0209651 A1 | 11/2003 | Iwasaki | |
| 2018/0081098 A1 | 3/2018 | Smith et al. | |
| 2018/0301494 A1* | 10/2018 | Park | H01L 27/14623 |
| 2018/0366593 A1* | 12/2018 | Huang | H01L 31/02327 |
| 2019/0019000 A1* | 1/2019 | Lee | G02B 5/20 |
| 2020/0301187 A1* | 9/2020 | Lin | G02B 5/008 |
| 2020/0381470 A1* | 12/2020 | Ho | H01L 27/1462 |

FOREIGN PATENT DOCUMENTS

| | | | | |
|---|---|---|---|---|
| JP | H 0527196 A * | 2/1993 | | G02B 27/00 |
| TW | 202010140 | 3/2020 | | |
| WO | 2017021152 | 2/2017 | | |
| WO | 2018127101 | 7/2018 | | |
| WO | WO-2022027257 A1 * | 2/2022 | | G06K 9/00 |

\* cited by examiner

FINGERPRINT SENSING SYSTEM

CROSS-REFERENCE TO RELATED APPLICATION

This application claims the priority of Taiwan patent application serial no. 110104177, filed on Feb. 4, 2021. The entirety of the above-mentioned patent application is hereby incorporated by reference and made a part of this specification.

BACKGROUND

Technical Field

The disclosure relates to a sensing system and particularly relates to a fingerprint sensing system.

Description of Related Art

Existing in-display fingerprint sensing systems may be roughly categorized into two types. The fingerprint sensing system of the first type adopts an optical collimator, which is, for instance, a pinhole array layer. Since the optical collimator may be an optical thin film, the fingerprint sensing system of the first type has an advantage of small overall thickness. When the fingerprint sensing system is applied in a smart phone, the small thickness of the fingerprint sensing system is conducive to an increase in the volume of the battery module. However, since the optical collimator and a sensor cannot be completely formed in one semiconductor manufacturing process, and a packaging process is required to package the optical collimator and the sensor together, the resultant fingerprint sensing system of the first type is not cost-effective.

The fingerprint sensing system of the second type adopts a lens array. Since the lens array is formed by performing a mature manufacturing process, the fingerprint sensing system of the second type has the advantage of lower costs. However, both the thickness of the lens array itself and the distance of the imaging focal length should be taken into consideration, whereby the thickness of the fingerprint sensing system of the second type cannot be easily reduced.

SUMMARY

The disclosure provides a fingerprint sensing system, which simultaneously has advantages of small overall thickness and low costs.

In an embodiment of the disclosure, a fingerprint sensing system is configured to receive an illumination beam which is reflected by a finger and then transmitted to the fingerprint sensing system to generate a fingerprint image. The fingerprint sensing system includes a plurality of microlenses, a sensor, a first light filter layer, and a second light filter layer. The microlenses are arranged in an array. The sensor has a plurality of sensing pixels arranged in an array. The first light filter layer is disposed between the microlenses and the sensor and has a plurality of first openings. The second light filter layer is disposed between the first light filter layer and the sensor and has a plurality of second openings. The illumination beam passes through the first openings or the second openings, so that the sensor receives the illumination beam.

In view of the above, according to one or more embodiments of the disclosure, the fingerprint sensing system adopts the first and second light filter layers which are similar to the pinhole array layer; therefore, the cost of the fingerprint sensing system provided herein is lower than that of the fingerprint sensing system of the first type, and the overall thickness of the fingerprint sensing system provided herein is relatively small.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
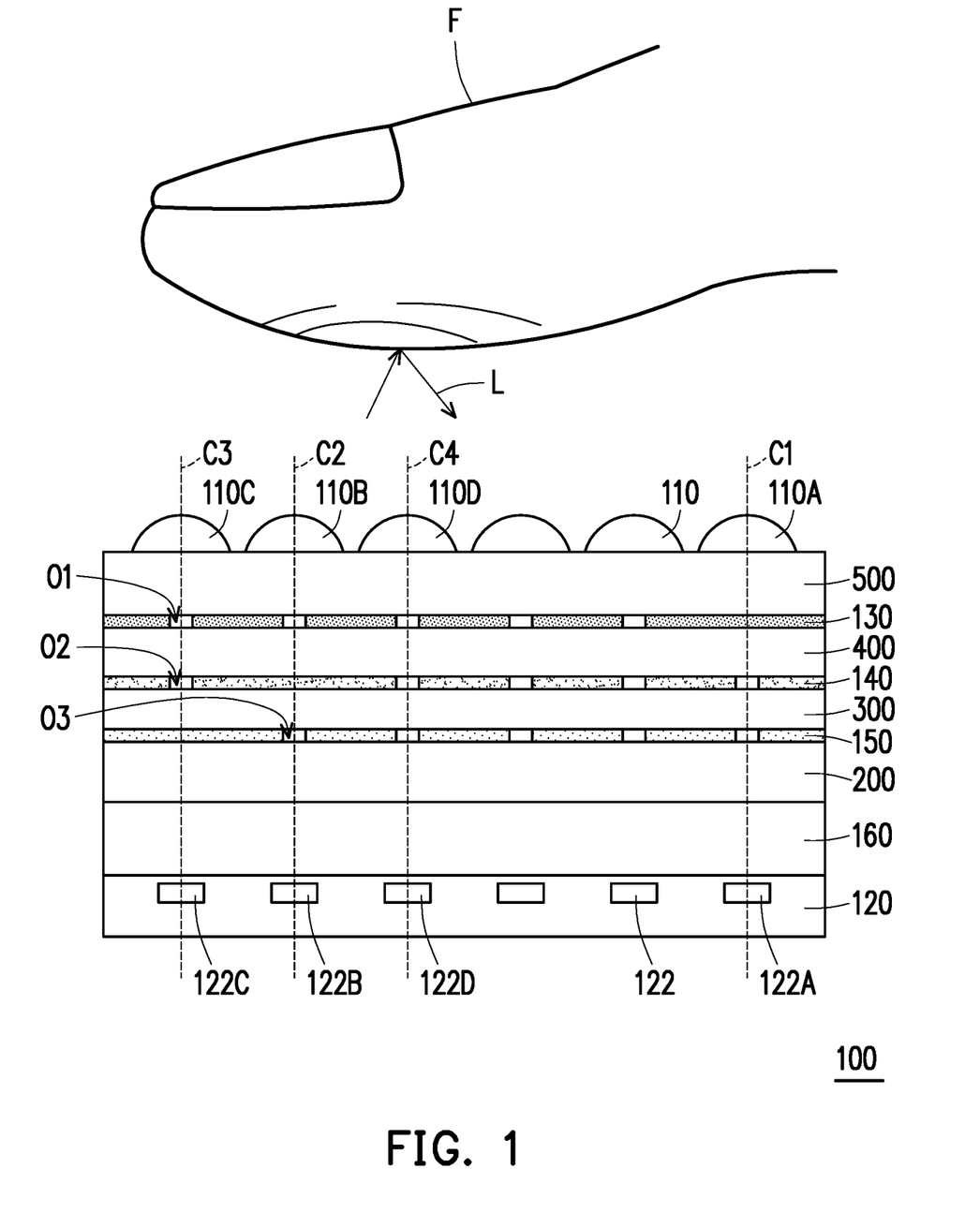
FIG. 1 is a schematic cross-sectional view illustrating a fingerprint sensing system according to an embodiment of the disclosure.
Figure 2:
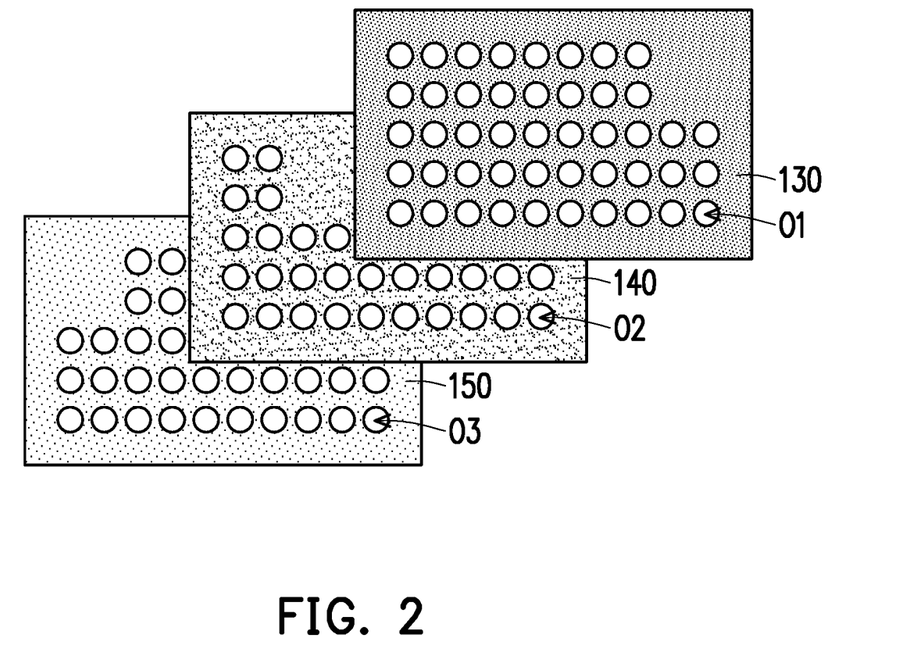
FIG. 2 is a schematic top view illustrating the first light filter layer, the second light filter layer, and the third light filter layer depicted in FIG. 1.

FIG. 1 is a schematic cross-sectional view illustrating a fingerprint sensing system according to an embodiment of the disclosure. FIG. 2 is a schematic top view illustrating the first light filter layer, the second light filter layer, and the third light filter layer depicted in FIG. 1. With reference to FIG. 1 and FIG. 2, a fingerprint sensing system 100 provided in an embodiment of the disclosure is configured to receive an illumination beam L which is reflected by a finger F and then transmitted to the fingerprint sensing system 100 to generate a fingerprint image. The fingerprint sensing system 100 includes a plurality of microlenses 110, a sensor 120, a first light filter layer 130, and a second light filter layer 140.

In this embodiment, the microlenses 110 are arranged in an array. The sensor 120 has a plurality of sensing pixels 122 arranged in an array. The sensor 120 may be an optical sensor of a thin film transistor (TFT), a complementary metal-oxide semiconductor (CMOS), or a charge-coupled device (CCD).

In this embodiment, the first light filter layer 130 is disposed between the microlenses 110 and the sensor 120 and has a plurality of first openings O1. The second light filter layer 140 is disposed between the first light filter layer 130 and the sensor 120 and has a plurality of second openings O2. The first light filter layer 130 and the second light filter layer 140 are bandpass light filters and are the light filter layers of different color beams. For instance, the first light filter layer 130 may be a red beam filter layer that allows a red beam to pass but filters out the other color beams. The second light filter layer 140 may be a green beam filter layer that allows a green beam to pass but filters out the other color beams. However, these should not be construed as limitations in the disclosure, and the first light filter layer 130 or the second light filter layer 140 may also be a light filter layer of another color beam.

In this embodiment, the fingerprint sensing system 100 further includes a third light filter layer 150 and has a plurality of third openings O3. The third light filter layer 150 is disposed between the second light filter layer 140 and the sensor 120. The third light filter layer 150 is a band-pass filter and is a light filter layer of a different color beam from the first light filter layer 130 and the second light filter layer 140. For instance, the third light filter layer 150 may be a blue beam filter layer that allows a blue beam to pass but filters out the other color beams. However, this should not be construed as a limitation in the disclosure, and the third light filter layer 150 may be a light filter layer of another color beam.

In this embodiment, an optical axis of each of the microlenses 110 passes through one of the first opening O1, one of the second openings O2, or one of the third openings O3, and passes through one of the sensing pixels 122. Alternatively, the optical axis of one of the microlenses 110 passes through two of the first openings O1, the second openings O2, and the third openings O3. Furthermore, the illumination beam L passes through the first openings O1, the second openings O2, or the third openings O3, so that the sensor 120 receives the illumination beam L.

For instance, the optical axis C1 of the microlenses 110A passes through the second openings O2, the third openings O3, and the sensing pixels 122A, so that the sensing pixels 122A receive the red beam of the illumination beam L. The optical axis C2 of the microlenses 110B passes through the first openings O1, the third openings O3, and the sensing pixels 122B, so that the sensing pixels 122B receive the green beam of the illumination beam L. The optical axis C3 of the microlenses 110C passes through the first openings O1, the second openings O2, and the sensing pixels 122C, so that the sensing pixels 122C receive the blue beam of the illumination beam L. The optical axis C4 of the microlenses 110D passes through the first openings O1, the second openings O2, the third openings O3, and the sensing pixels 122D, so that the sensing pixels 122D receive all the color beams of the illumination beam L (e.g., white beams). In other words, the openings through which the optical axis of each of the microlenses passes determines the color beams which may be received by the corresponding sensing pixels 122, so that the fingerprint sensing system 100 may flexibly decide the sensing target of each sensing pixel 122. For instance, the sensing pixels 122D for sensing the white beam may be designed to sense the fingerprint image, and the sensing pixels 122A, 122B, and 122C for sensing the other color beams may be designed as reference pixels configured to improve the accuracy of the fingerprint recognition algorithm.

In light of the foregoing, according to an embodiment of the disclosure, the fingerprint sensing system 100 includes the microlenses 110, the first light filter layer 130, and the second light filter layer 140, and these optical layers and the sensor 120 may be formed in one semiconductor manufacturing process. Accordingly, the production cost of the fingerprint sensing system 100 provided in the embodiment of the disclosure is lower than that of the first-type fingerprint sensing system. Furthermore, the thickness of the microlenses 110 is small, and the functions of the first light filter layer 130 and the second light filter layer 140 are similar to those of the pinhole array layer. Therefore, the overall thickness of the fingerprint sensing system 100 is relatively small.

In addition, in this embodiment, the first light filter layer 130 is arranged on the second light filter layer 140, so that an oblique illumination beam is mostly filtered out by the light filter layer 130 or 140; as such, stray beams cannot easily enter the sensor 120. Moreover, the microlenses 110 may be applied to image the illumination beam onto the sensor 120, which also improves the sensing effect of the fingerprint sensing system 100.

Figure 3:
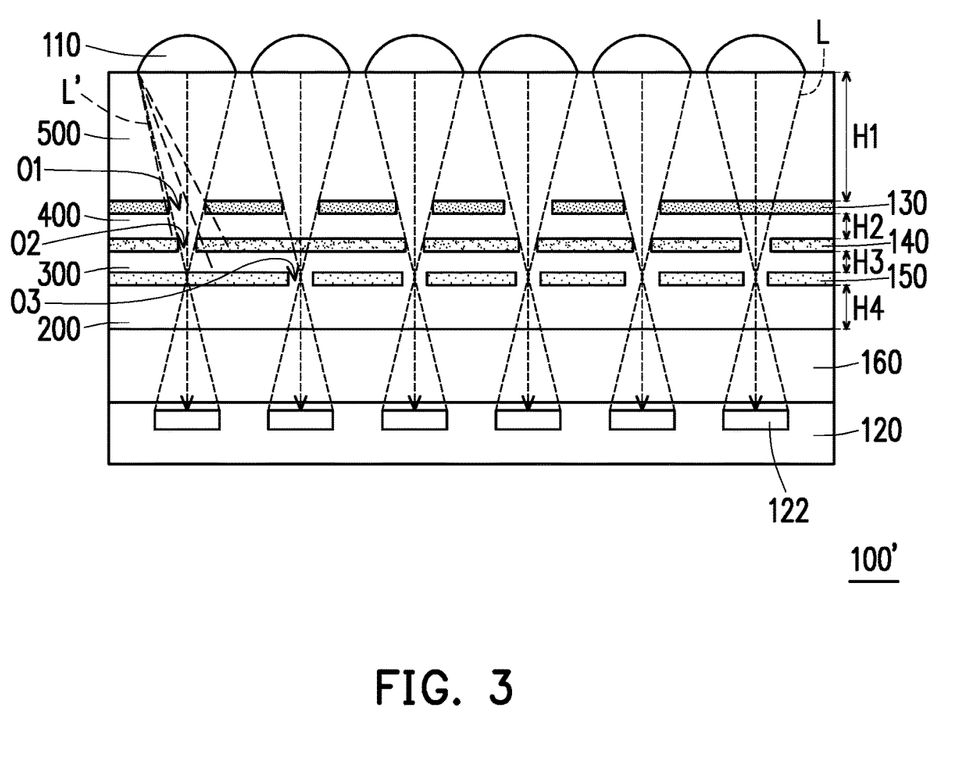
FIG. 3 is a schematic cross-sectional view illustrating a fingerprint sensing system according to another embodiment of the disclosure.

FIG. 3 is a schematic cross-sectional view illustrating a fingerprint sensing system according to another embodiment of the disclosure. With reference to FIG. 3, a fingerprint sensing system 100' provided in this embodiment is similar to the fingerprint sensing system 100 depicted in FIG. 1, while the main differences are described below. The first openings O1 have a plurality of identical opening sizes, and the opening sizes of the first openings O1 fall within a range of 5 μm to 30 μm. The second opening O2 have a plurality of identical opening sizes, and the opening sizes of the second openings O2 fall within a range of 5 μm to 30 μm. The third opening O3 have a plurality of identical opening sizes, and the opening sizes of the third openings O3 fall within a range of 5 μm to 30 μm.

In addition, in another embodiment, the opening sizes of the first openings O1 are different from the opening sizes of the second openings O2 or the opening sizes of the third openings O3, or the opening sizes of the second openings O2 are different from the opening sizes of the third openings O3. For instance, in FIG. 3, the opening sizes of the first openings O1 are different from the opening sizes of the second openings O2 or the opening sizes of the third openings O3, so as to better focus the reflected beam and prevent interference of the stray beams.

As shown in FIG. 1 and FIG. 3 at the same time, in this embodiment, the fingerprint sensing system 100' further includes an infrared (IR) cutoff light filter layer 160. The IR cutoff filter layer 160 is disposed between the third light filter layer 150 and the sensor 120. Here, one of a first distance H1, a second distance H2, a third distance H3, and a fourth distance H4 may be different from the other distances. The first distance H1 is the distance between the microlenses 110 and the first light filter layer 130 (i.e., the thickness of a transparent layer 500), the second distance H2 is the distance between the first light filter layer 130 and the second light filter layer 140 (i.e., the thickness of a transparent layer 400), the third distance H3 is the distance between the second light filter layer 140 and the third light filter layer 150 (i.e., the thickness of a transparent layer 300), and the fourth distance H4 is the distance between the third light filter layer 150 and the IR cutoff filter layer 160 (i.e., the thickness of a transparent layer 200). For instance, the first distance H1 is different from the second distance H2, the third distance H3, or the fourth distance H4. The second distance H2 and the third distance H3 may be the same. The third distance H3 is different from the fourth distance H4.

In addition, in this embodiment, the first distance H1 falls within a range of 2 μm to 10 μm, the second distance H2 falls within a range of 2 μm to 10 μm, the third distance H3 falls within a range of 2 μm to 10 μm, and the fourth distance H4 falls within a range of 2 μm to 10 μm.

In view of the above, in the fingerprint sensing system 100' provided in an embodiment of the disclosure, the opening size of each opening O1, O2, and O3 and each distance H1, H2, H3 designed according to pitches between the microlenses 110 achieve favorable sensing effects of the fingerprint sensing system 100'. For instance, each distance H1, H2, H3 may be adjusted, so that the distance from the microlenses 110 and the sensor 120 approximates to the focal length of the microlenses 110. Besides, the adjusted opening size and the adjusted distance allow an oblique illumination beam L' to be filtered out by the light filter layers 130, 140, and 150 in a more effective manner, so that stray beams are less likely to enter the sensor 120.

Figure 4A:
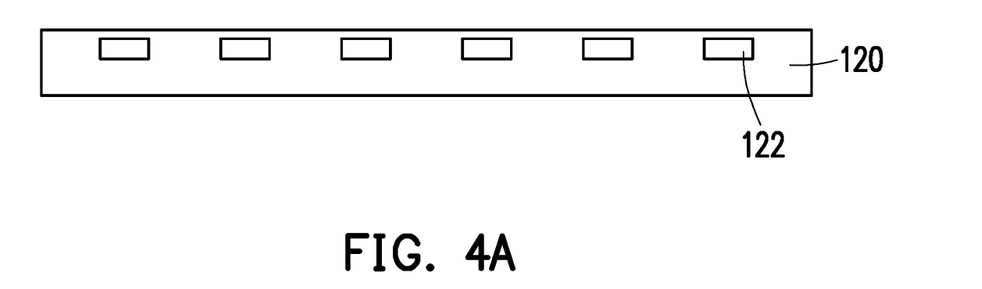
FIG. 4A to FIG. 4G are schematic cross-sectional view of a manufacturing process of the fingerprint sensing system depicted in FIG. 1.
Figure 4B:
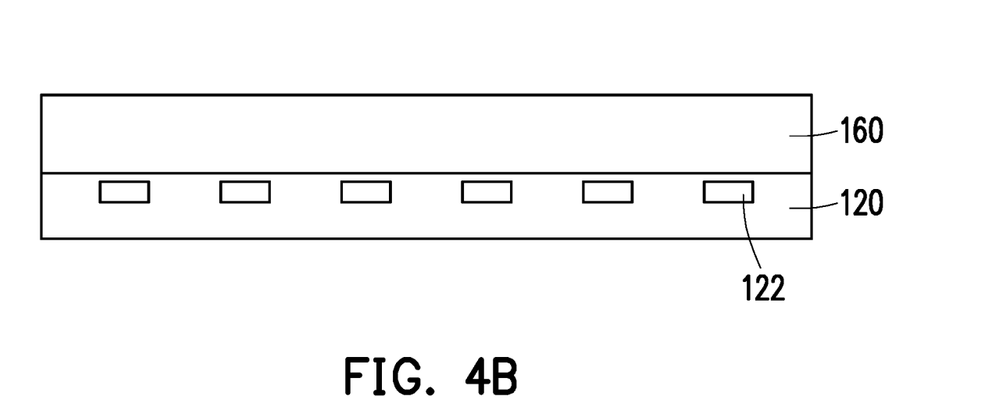
Figure 4C:
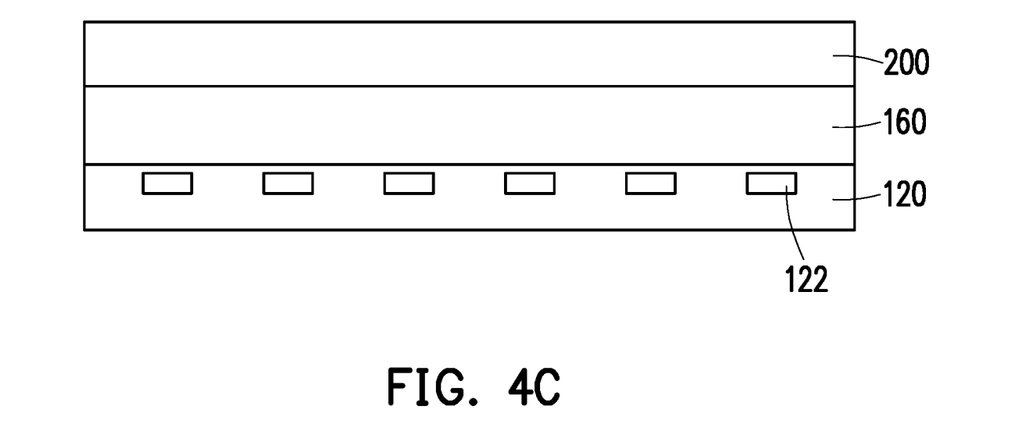
Figure 4D:
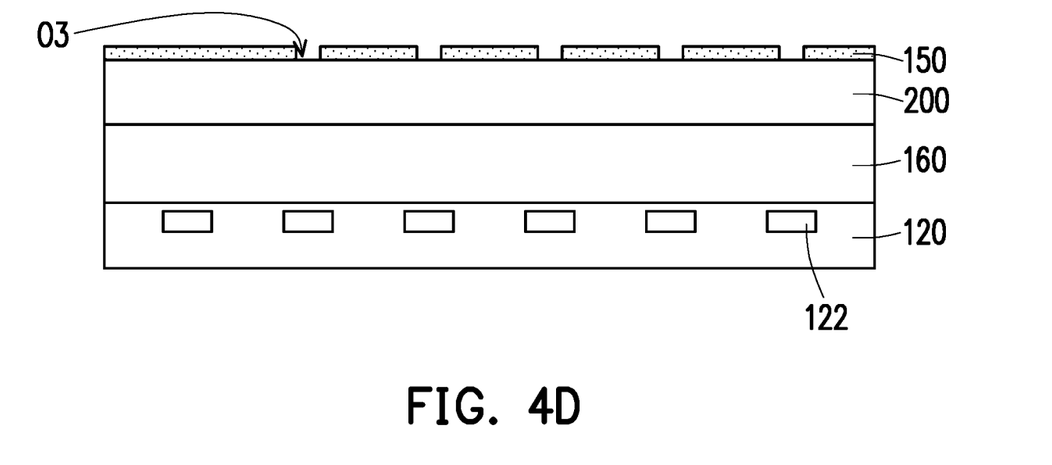
Figure 4E:
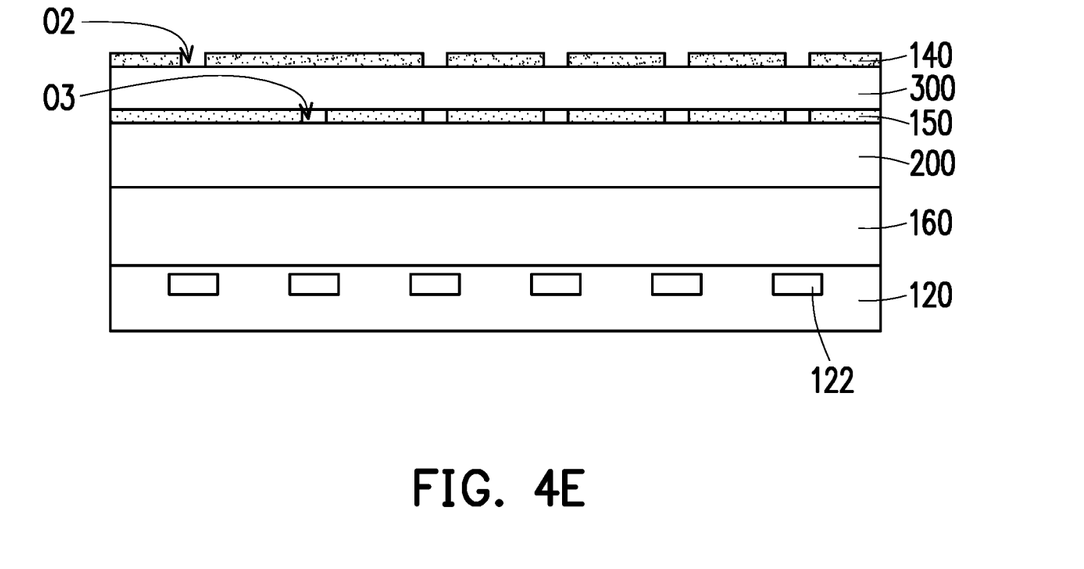
Figure 4F:
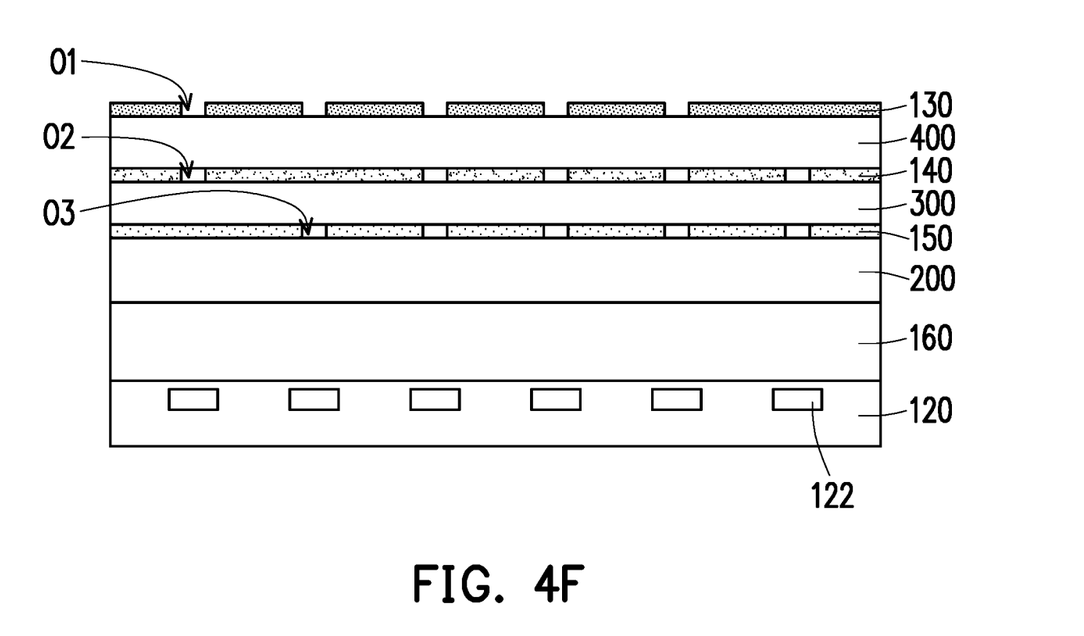
Figure 4G:
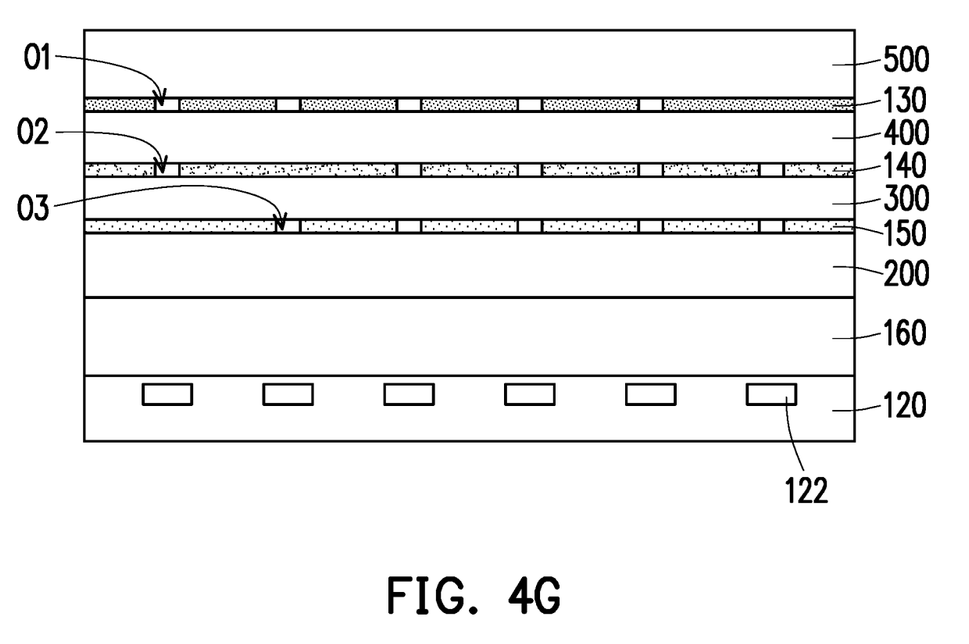

FIG. 4A to FIG. 4G are schematic cross-sectional view of a manufacturing process of the fingerprint sensing system depicted in FIG. 1. With reference to FIG. 1 and FIG. 4A to FIG. 4G, in FIG. 4A, the sensor 120 is formed, and an IR cutoff filter layer 160 and the transparent layer 200 are sequentially formed on the sensor 120, as shown in FIG. 4A, FIG. 4B, and FIG. 4C. Next, the third light filter layer 150, the transparent layer 300, the third light filter layer 140, the transparent layer 400, the first light filter layer 130, and the transparent layer 500 are sequentially formed on the transparent layer 200. Finally, the microlenses 110 are formed on the transparent layer 500 to form the fingerprint sensing system 100. In this embodiment, the transparent layers 200, 300, 400, and 500 may be made of transparent insulating materials, such as transparent photoresist and silicon dioxide, which should however not be construed as a limitation in the disclosure.

To sum up, in one or more embodiments of the disclosure, the fingerprint sensing system includes the microlenses, the first light filter layer, and the second light filter layer, and these optical layers and the sensor may be formed in one semiconductor manufacturing process. Accordingly, the production cost of the fingerprint sensing system provided herein is lower than that of the first-type fingerprint sensing system. Besides, the thickness of the microlenses is small, and the first light filter layer and the second light filter layer are optical thin films, whereby the overall thickness of the fingerprint sensing system is relatively small.

It will be apparent to those skilled in the art that various modifications and variations can be made to the disclosed embodiment without departing from the scope or spirit of the disclosure. In view of the foregoing, it is intended that the disclosure covers modifications and variations, provided that they fall within the scope of the following claims and their equivalents.

What is claimed is:

1. A fingerprint sensing system, configured to receive an illumination beam reflected by a finger and transmitted it to the fingerprint sensing system to generate a fingerprint image, the fingerprint sensing system comprising:
   a plurality of microlenses, arranged in an array;
   a sensor, having a plurality of sensing pixels arranged in an array;
   a first light filter layer, disposed between the microlenses and the sensor and having a plurality of first openings;
   a second light filter layer, disposed between the first light filter layer and the sensor and having a plurality of second openings,
   wherein an optical axis of one of the microlenses only passes through one of the first openings and the second openings,
   wherein the first light filter layer is configured to allow a color beam to pass but filter out the other color beams, the second light filter layer is configured to allow another color beam different from a light color of the color beam to pass but filter out the other color beams, and the third light filter layer is configured to allow yet another color beam different from the light color of the color beam and a light color of the another color beam to pass but filter out the other color beams;
   a third light filter layer, disposed between the second light filter layer and the sensor and having a plurality of third openings,
   wherein the illumination beam passes through the first openings, the second openings, or the third openings, so that the sensor receives the illumination beam,
   wherein an optical axis of one of the microlenses simultaneously passes through one of the first openings, one of the second openings and one of the third openings; and
   an infrared cutoff filter layer, disposed between the third light filter layer and the sensor,
   wherein one of a first distance, a second distance, a third distance, and a fourth distance is different from the other distances,
   the first distance is a distance from the microlenses to the first light filter layer,
   the second distance is a distance from the first light filter layer to the second light filter layer,
   the third distance is a distance from the second light filter layer to third light filter layer, and
   the fourth distance is a distance from the third light filter layer to the infrared cutoff filter layer.

2. The fingerprint sensing system according to claim 1, wherein an optical axis of each of the microlenses passes through one of the first openings or one of the second openings.

3. The fingerprint sensing system according to claim 1, wherein the first openings have a plurality of identical opening sizes, and the opening sizes of the first openings fall within a range of 5 μm to 30 μm.

4. The fingerprint sensing system according to claim 1, wherein the second openings have a plurality of identical opening sizes, and the opening sizes of the second openings fall within a range of 5 μm to 30 μm.

5. The fingerprint sensing system according to claim 1, wherein an optical axis of each of the microlenses passes through one of the first openings, one of the second openings, or one of the third openings.

6. The fingerprint sensing system according to claim 1, wherein an optical axis of one of the microlenses only passes through two of the first openings, the second openings, and the third openings.

7. The fingerprint sensing system according to claim 1, wherein the third openings have a plurality of identical opening sizes, and the opening sizes of the third openings fall within a range of 5 μm to 30 μm.

* * * * *